United States Patent
Winter et al.

(10) Patent No.: US 7,670,643 B2
(45) Date of Patent: Mar. 2, 2010

(54) METHOD AND SYSTEM FOR DISPENSING RESIST SOLUTION

(75) Inventors: Thomas Winter, Parsonsfield, ME (US); Minoru Kubota, Fishkill, NY (US)

(73) Assignee: Tokyo Electron Limited, Tokyo (JP)

( * ) Notice: Subject to any disclaimer, the term of this patent is extended or adjusted under 35 U.S.C. 154(b) by 1274 days.

(21) Appl. No.: 10/880,556

(22) Filed: Jul. 1, 2004

(65) Prior Publication Data
US 2006/0013953 A1    Jan. 19, 2006

(51) Int. Cl.
*B05D 1/02* (2006.01)
*B05D 3/12* (2006.01)

(52) U.S. Cl. ............ 427/240; 427/425; 427/427.2; 427/427.3; 156/52; 156/313; 156/320; 156/321; 156/323; 438/758

(58) Field of Classification Search ........... 427/240, 427/425, 427.2, 427.3; 118/52, 320, 321, 118/323, 313; 438/758
See application file for complete search history.

(56) References Cited

U.S. PATENT DOCUMENTS

| 3,198,657 | A | 8/1965 | Kimball et al. |
| 5,094,884 | A | 3/1992 | Hillman et al. |
| 5,902,399 | A | 5/1999 | Courtenay |
| 6,319,317 | B1 | 11/2001 | Takamori |
| 6,642,155 | B1 | 11/2003 | Whitman et al. |

*Primary Examiner*—Kirsten C Jolley
(74) *Attorney, Agent, or Firm*—Oblon, Spivak, McClelland, Maier & Neustadt, L.L.P.

(57) ABSTRACT

An apparatus and method for dispensing a solution on a substrate is described in which the solution is dispensed through a solution nozzle assembly while the substrate is rotated. As the solution is dispensed, the solution on the substrate forms a wave front that radially spreads from the substrate center to the substrate edge. The dispensing of the solution is performed in such a way that the solution is dispensed at a radial location substantially equivalent to or less than the radial location of the wave front at any instant in time.

20 Claims, 7 Drawing Sheets

1

METHOD AND SYSTEM FOR DISPENSING RESIST SOLUTION

BACKGROUND OF THE INVENTION

1. Field of the Invention

The present invention relates to a method and system for dispensing a material solution on a substrate, and, more particularly, to a method and system for dispensing a material solution on a substrate in order to reduce the volume of dispensed fluid.

2. Description of the Related Art

In material processing methodologies, pattern etching includes the application of a thin layer of light-sensitive material, such as photoresist, to an upper surface of a substrate that is subsequently patterned in order to provide a mask for transferring this pattern to the substrate during etching. The patterning of the light-sensitive material generally involves coating an upper surface of the substrate with a thin film of light-sensitive material, exposing the thin film of light-sensitive material to a radiation source through a reticle (and associated optics) using, for example, a micro-lithography system, followed by a developing process during which the removal of the irradiated regions of the light-sensitive material occurs (as in the case of positive photoresist), or the removal of non-irradiated regions occurs (as in the case of negative resist) using a developing solvent.

During the coating process, a substrate is positioned on a substrate holder, and it is rotated at high speed, i.e., several thousand or tens of thousand revolutions per minute (rpm), while resist solution is dispensed on an upper surface of the substrate. When, for example, the resist solution is dispensed at the center of the substrate, the resist solution spreads radially across the substrate due to centrifugal forces imposed by the substrate rotation. In order to reduce the costs associated with resist solution dispensing, the total volume (or shot size) of resist solution that is dispensed is minimized, which places greater emphasis on the design of dispensing parameters (i.e., rotation rate, dispensing rate, resist solution fluid properties, etc.) sufficient to achieve a uniform coating on the substrate.

SUMMARY OF THE INVENTION

One object of the invention is to provide a method and apparatus for dispensing a solution on a substrate that overcomes or reduces problems of conventional coating systems.

Another object of the present invention is to provide a method and apparatus for dispensing a solution on a substrate using a reduced shot size.

According to one aspect of the invention, a solution nozzle assembly for dispensing a solution on a substrate is described. The assembly includes one or more nozzles configured to dispense the solution on an upper surface of the substrate while the substrate is rotated causing the solution dispensed on the substrate to form a wave front that spreads radially across the upper surface of the substrate. A controller causes the one or more nozzles to initially dispense the solution substantially at the center of the substrate, and progress to dispense the solution at a radial location substantially equivalent to or less than a radial position of the wave front at any instant in time.

According to yet another aspect of the invention, a coating system for dispensing a solution on a substrate is described. The system includes a coating chamber; a substrate holder coupled to the coating chamber and configured to support the substrate; a drive unit coupled to the substrate holder and configured to rotate the substrate holder; and a solution nozzle assembly coupled to the coating chamber and configured to dispense the solution on the substrate from one or more nozzles in order to form a wave front that spreads radially across the upper surface of the substrate. A controller causes the nozzle assembly to initially dispense the solution substantially at the center of the substrate, and progress to dispense the solution at a radial location substantially equivalent to or less than a radial position of the wave front at any instant in time.

According to yet another aspect of the invention, a method of dispensing a solution on a substrate is described. The method includes rotating the substrate; dispensing the solution from a solution nozzle assembly on the substrate in order to form a wave front that spreads radially across the upper surface of the substrate. The solution initially dispenses at the center of the substrate, and progresses to dispense at a radial location substantially equivalent to or less than a radial position of the wave front at any instant in time. The method also includes terminating the dispensing of the solution; and terminating the rotating of the substrate.

According to yet another object of the invention, a computer readable medium containing program instructions for execution on a processor, which when executed by the processor cause a coating system to perform the following steps: rotating the substrate; dispensing the solution from a solution nozzle assembly on the substrate in order to form a wave front that spreads radially across the upper surface of the substrate, wherein the solution initially dispenses at the center of the substrate, and progresses to dispense at a radial location substantially equivalent to or less than a radial position of the wave front at any instant in time; terminating the dispensing of the solution; and terminating the rotating of the substrate.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the dispensing system. However, it should be understood that the invention may be practiced in other embodiments that depart from these specific details.

Embodiments of the invention are described in detail below with reference to the accompanying drawings. As an embodiment according to the present application, an apparatus for dispensing a resist solution on a substrate utilized for a resist solution coating-developing system in semiconductor manufacturing will be described below.

Figure 1:
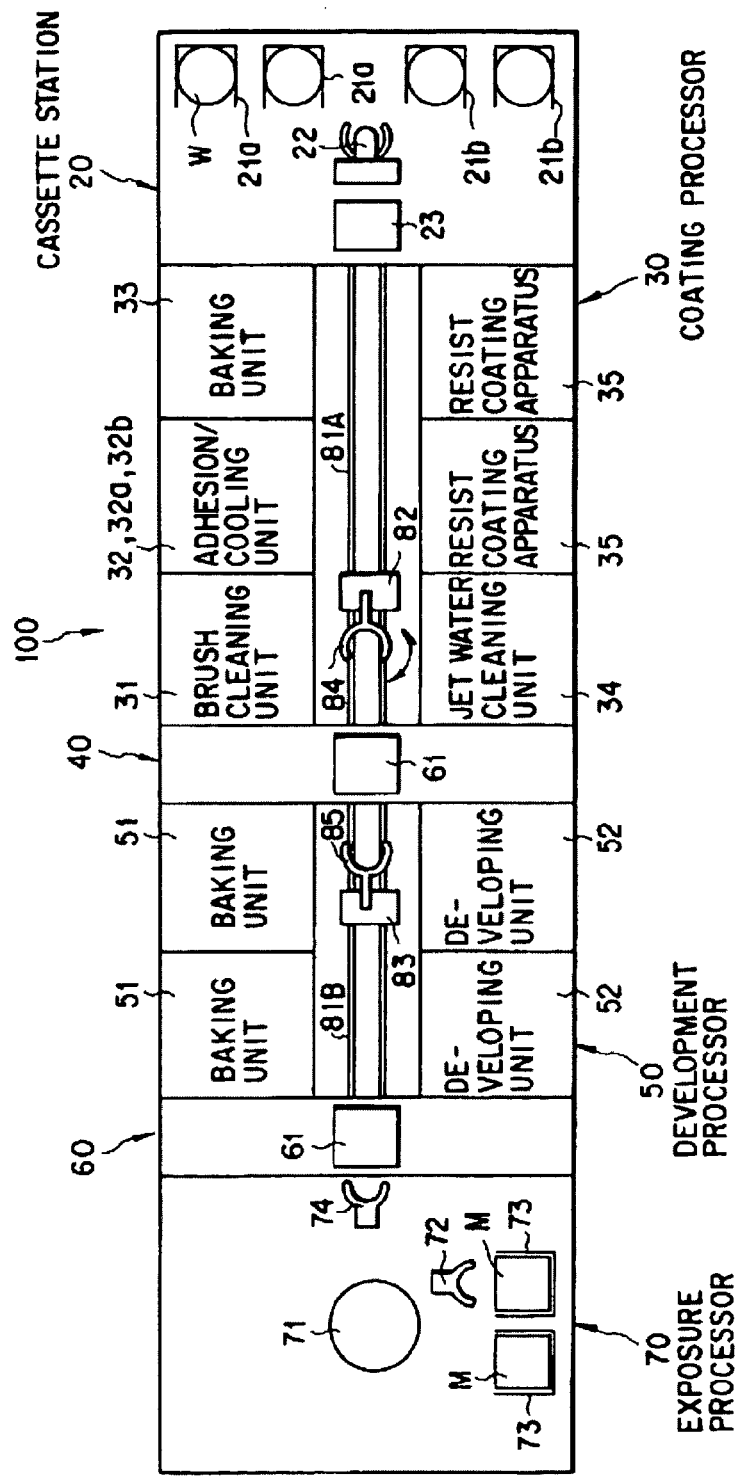
FIG. 1 is a schematic view of a resist solution coating-developing system of the present invention including a film forming apparatus.

Referring now to the drawings, FIG. 1 is a schematic view showing a resist solution coating-developing system (or track system) according to one embodiment of the apparatus for dispensing a solution. As shown in FIG. 1, a resist solution coating-developing system 100 includes a cassette station 20 in which first cassettes 21a for storing unprocessed objects, e.g., substrates (or wafers W) and second cassettes 21b for storing processed substrates (or wafers W) are arranged in respective predetermined positions. The cassette station 20 includes a substrate transfer forceps 22 for loading and unloading substrates between cassettes 21a and 21b and a transfer table 23, a coating processor 30 coupled to the cassette station 20 to form a resist film on the surface of the substrate, a development processor 50 coupled to the coating processor 30 with an interface unit 40 to develop the exposed substrate, and an exposure processor 70. The exposure processor 70 is coupled to a development processor 50 via an interface unit 60 to irradiate ultraviolet light from a light source onto the coated substrate through a predetermined mask member M and expose the resist film to a predetermined circuit pattern. The exposure processor 70 includes cassette 73 for storing the mask member M to be placed upon the upper surface of a substrate, mask member transfer arm 72, substrate transfer arm 74, and substrate processing surface 71 (or table). The interface units 40 and 60 include transfer stations 61.

Linear transfer paths 81A and 81B extend in central portions of the coating processor 30 and the development processor 50, respectively. Transfer mechanisms 82 and 83 are movable along the transfer paths 81A and 81B, respectively. The transfer mechanisms 82 and 83 have substrate arms 84 and 85, respectively, which can move in X and Y directions in a horizontal plane and in a vertical direction (Z direction) and freely rotate (θ).

On one side along the side edge of the transfer path 81A in the coating processor 30, a brush cleaning unit 31, an adhesion/cooling unit 32 which performs a hydrophobic treatment and in which an adhesion unit 32a and a cooling unit 32b are stacked, and a baking unit 33 as a first heating unit are arranged adjacent to each other along a line. On the other side of the transfer path 81A, a jet water cleaning unit 34 and an arbitrary number of, for example, two resist coating apparatuses 35 as film forming apparatuses are arranged adjacent to each other in a line. The resist coating apparatuses 35 can spin-coat substrates with various types of resist solutions including a regular resist solution and an antireflection resist solution.

The baking unit 33 and the resist coating apparatuses 35 oppose each other on the two sides of the transfer path 81A. Since the baking unit 33 and the resist coating apparatuses 35 thus oppose each other at a distance on the two sides of the transfer path 81A, heat from the baking unit 33 is prevented from being conducted to the resist coating apparatuses 35. Consequently, when resist coating is performed the resist film can be protected from thermal influences. On one side along the side edge of the transfer path 82B in the developing processor 50, baking units 51 are arranged adjacent to each other along a line. On the other side of the transfer path 81B, developing units 52 are arranged adjacent to each other along a line. The baking units 51 and developing units 52 oppose each other at a distance on the two sides of the transfer path 82B.

The resist solution coating-developing system can be configured for processing 248 nm resists, 193 nm resists, 157 nm resists, EUV resists, (top/bottom) anti-reflective coatings (TARC/BARC), and top coats. Additionally, for example, the resist solution coating-developing system can comprise a Clean Track ACT 8, or ACT 12 resist coating and developing system commercially available from Tokyo Electron Limited (TEL).

Figure 2:
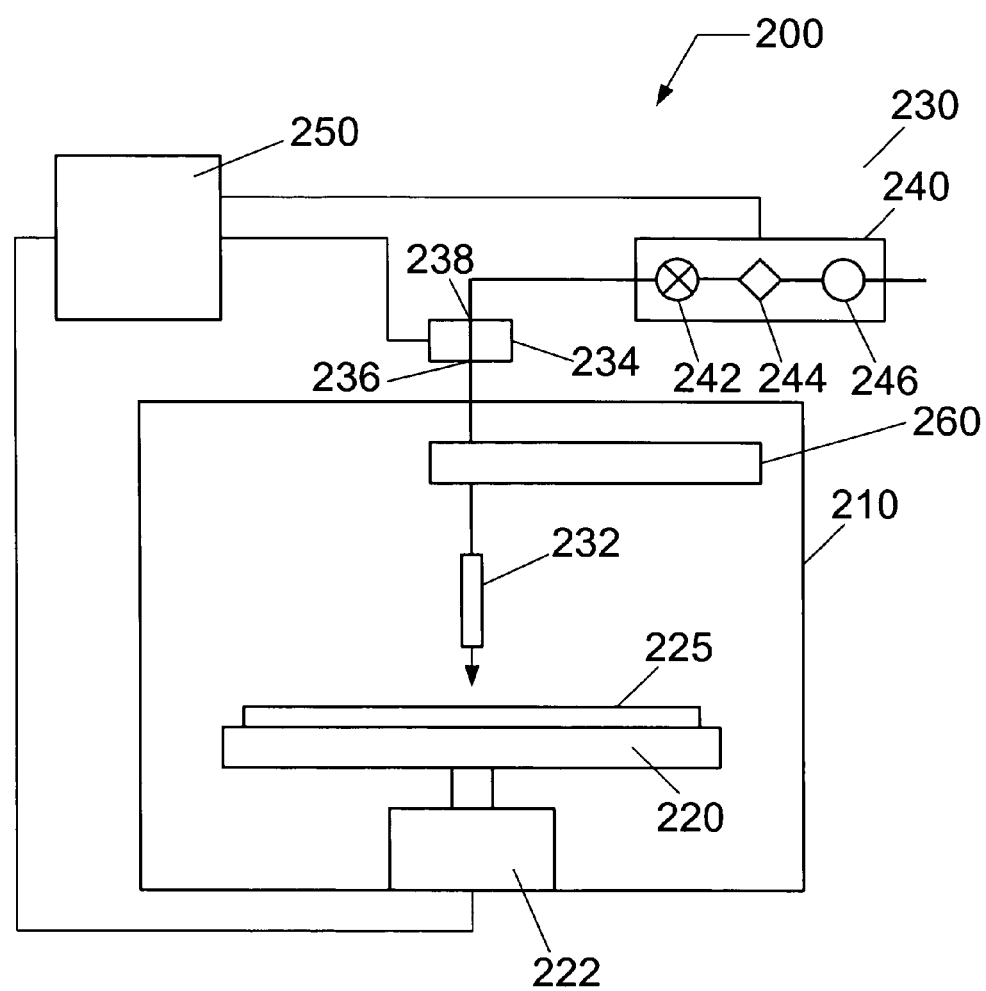
FIG. 2 presents a coating system for dispensing a solution on a substrate according to an embodiment of the invention.

FIG. 2 illustrates a coating system 200 including a coating chamber 210, a substrate holder 220 coupled to the coating chamber 210 and configured to support substrate 225, and a solution nozzle assembly 230 configured to dispense a solution, such as a resist solution. Additionally, the coating system 200 includes a controller 250 coupled to the substrate holder 220 and the solution nozzle assembly 230, and configured to exchange data, information, and control signals with the substrate holder 220 and the solution nozzle assembly 230.

The substrate holder 220 is configured to rotate (or spin) substrate 225 during dispensing of solution on the upper surface of substrate 225 from the solution nozzle assembly 230. A drive unit 222 coupled to the substrate holder 220 is configured to rotate the substrate holder 220. The drive unit 222 can, for example, permit setting the rotation rate, and the rate of acceleration of the substrate holder rotation.

The solution nozzle assembly 230 includes a single nozzle 232 positioned substantially near the center of substrate 225, and above an upper surface thereof. The nozzle 232 is configured to dispense a solution, such as a 248 nm photo-resist solution, a 193 nm photo-resist solution, a 157 nm photo-resist solution, an EUV (extreme ultraviolet) photo-resist solution, or any other coating solution, such as a low dielectric coating solution or a top/bottom anti-reflective coating (TARC/BARC) solution, on an upper surface of substrate 225 in a direction substantially perpendicular to the upper surface of substrate 225. The nozzle 232 is coupled to an outlet end 236 of a control valve 234. An inlet end 238 of control valve 234 is coupled to a solution supply system 240. The control valve 234 can be configured to regulate dispensing the solution on substrate 225. When open, the solution is dispensed upon the substrate 225. When closed, the solution is not dispensed upon the substrate 225. The solution supply system 240 can include at least one of a fluid supply valve 242, a filter 244, and a flow measurement/control device 246.

Additionally, nozzle 232 is configured to translate in a radial direction from the center of substrate 225 to the peripheral edge of substrate 225 using translation drive assembly 260, while dispensing solution.

Additionally, controller 250 includes a microprocessor, memory, and a digital I/O port (potentially including D/A and/or A/D converters) capable of generating control voltages sufficient to communicate and activate inputs to the drive unit 222 of substrate holder 220, the solution nozzle assembly 230 (e.g., first control valve 234), solution supply system 240, and translation drive system 260 as well as monitor outputs from these systems. A program stored in the memory is utilized to interact with these systems according to a stored process recipe. One example of controller 250 is a DELL PRECISION WORKSTATION 530™, available from Dell Corporation, Austin, Tex. The controller 250 may also be implemented as a general purpose computer such as the computer described with respect to FIG. 7.

Controller 250 may be locally located relative to coating system 200, or it may be remotely located relative to the coating system 200 via an internet or intranet. Thus, controller 250 can exchange data with coating system 200 using at least one of a direct connection, an intranet, and the internet. Controller 250 may be coupled to an intranet at a customer site (i.e., a device maker, etc.), or coupled to an intranet at a vendor site (i.e., an equipment manufacturer). Furthermore, another computer (i.e., controller, server, etc.) can access controller 250 to exchange data via at least one of a direct connection, an intranet, and the internet.

The system described in FIG. 2 allows resist solution to be dispensed substantially at the center of the substrate and then at a radial distance from the center of the substrate. The present inventors have discovered that this technique allows a reduced shot size of resist solution to be used to coat the substrate. Specifically, when a resist solution is dispensed only at the center of the substrate, the wave front may start out as a substantially circular shape. As the resist spreads across the full radial distance of the substrate however, the wave front may lose its circular shape and assume an irregular shape that results in leading portions of the wave front arriving at the perimeter of the wafer before other portions. This results in wasted resist when the leading portions of the wave front wash over the edge of the substrate. The present inventors have discovered that dispensing resist first at a substantially center portion of the substrate and then at a radial portion but within the wave front boundary provides better control of the resist wave front thereby allowing a smaller shot size.

Figure 3:
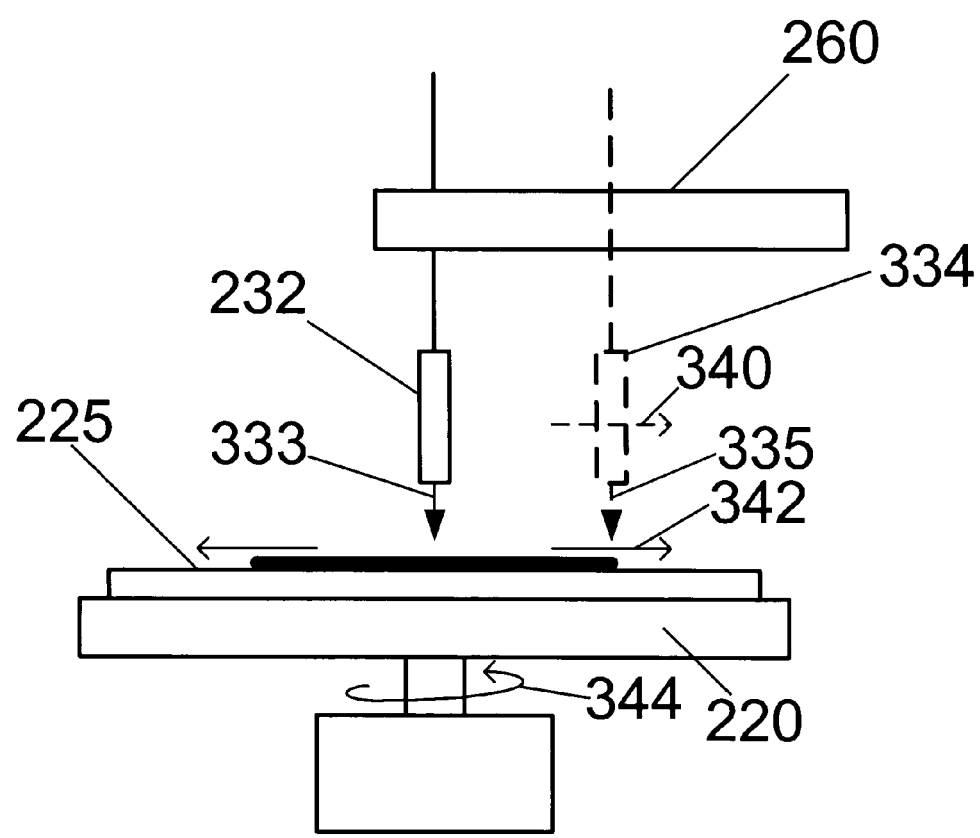
FIG. 3 illustrates a method of using the system depicted in FIG. 2.

Referring now to FIG. 3, a method for dispensing a solution on a substrate using the system depicted in FIG. 2 is described. The coating system 200 is configured to dispense the solution at a dispensing rate 333 from nozzle 232. The dispensing rate 333 can be maintained constant during solution dispensing, or it can be varied during solution dispensing. While solution is dispensed on substrate 225, the substrate holder 220 is rotated at a rotation rate 344. The rotation rate 344 can be maintained constant, or alternatively it can be varied during solution dispensing. Furthermore, during solution dispensing and substrate rotation, the solution spreads radially on the upper surface of substrate 225, wherein the solution wave front radially expands at front speed 342. According to an embodiment of the invention, the translation drive assembly 260 radially translates the nozzle 232 at a translation rate 340 that is substantially equivalent to or less than the front speed 342, as depicted by the phantom nozzle 334. For example, the translation rate 340 ranges from approximately 25% to approximately 100% the front speed 342. Alternately, the translation rate 340 ranges from approximately 50% to approximately 100% the front speed 342. Alternately, the translation rate 340 ranges from approximately 75% to approximately 100% the front speed 342. Alternately, the translation rate 340 ranges from approximately 90% to approximately 100% the front speed 342. Alternately, the translation rate 340 is substantially equivalent to the front speed 342.

Figure 4:
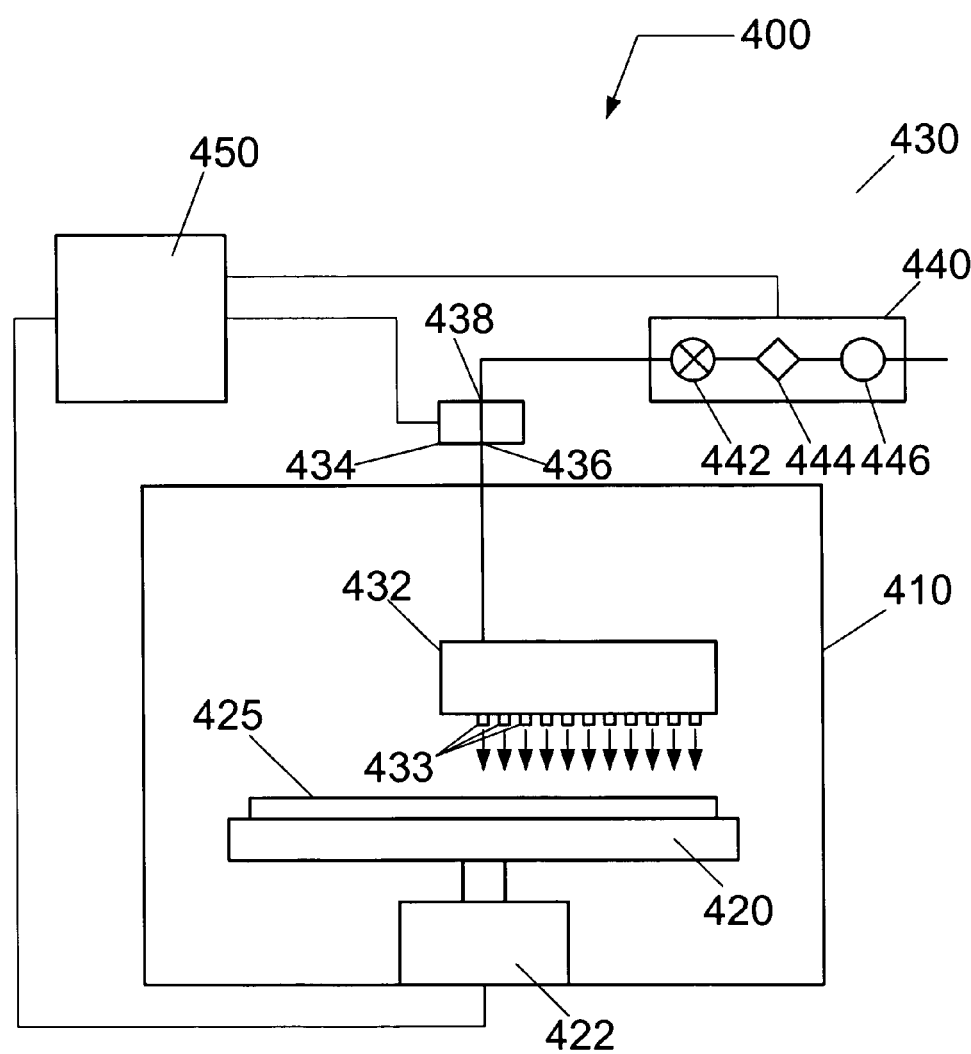
FIG. 4 presents a coating system for dispensing a solution on a substrate according to another embodiment of the invention.

According to another embodiment, FIG. 4 presents a coating system 400 including a coating chamber 410, a substrate holder 420 coupled to the coating chamber 410 and configured to support substrate 425, and a solution nozzle assembly 430 configured to dispense a solution, such as a resist solution. Additionally, the coating system 400 includes a controller 450 coupled to the substrate holder 420 and the solution nozzle assembly 430, and configured to exchange data, information, and control signals with the substrate holder 420 and the solution nozzle assembly 430.

The substrate holder 420 is configured to rotate (or spin) substrate 425 during dispensing of solution on the upper surface of substrate 425 from the solution nozzle assembly 430. A drive unit 422 coupled to the substrate holder 420 is configured to rotate the substrate holder 420. The drive unit 422 can, for example, permit setting the rotation rate, and the rate of acceleration of the substrate holder rotation.

The solution nozzle assembly 430 includes a nozzle array 432 having a plurality of nozzles 433 distributed radially above substrate 425 from, for example, the substrate center to the substrate edge. The nozzle array 432 is configured to dispense a solution, such as a 248 nm photo-resist solution, a 193 nm photo-resist solution, a 157 nm photo-resist solution, an EUV (extreme ultraviolet) photo-resist solution, or any other coating solution, such as a low dielectric coating solution or a top/bottom anti-reflective coating (TARC/BARC) solution, on an upper surface of substrate 425 in a direction substantially perpendicular to the upper surface of substrate 425. The nozzle array 432 is coupled to an outlet end 436 of a control valve 434. An inlet end 438 of control valve 434 is coupled to a solution supply system 440. The control valve 434 can be configured to regulate dispensing the solution on substrate 425. When open, the solution is dispensed upon the substrate 425. When closed, the solution is not dispensed upon the substrate 225. The solution supply system 440 can include at least one of a fluid supply valve 442, a filter 444, and a flow measurement/control device 446.

Referring still to FIG. 4, solution begins dispensing from the center nozzle in nozzle array 432 and proceeds to the second nozzle in nozzle array 432 as the wave front of the solution on substrate 425 passes the radial location of the second nozzle. Thereafter, each nozzle begins dispensing solution as the wave front passes its respective radial location. When solution begins dispensing from the next nozzle, it continues dispensing from the preceding nozzle. Alternatively, when solution begins dispensing from the next nozzle, it discontinues dispensing from the preceding nozzle. Thus, as with the embodiment of FIG. 3, the configuration of FIG. 4 provides improved control over the wave front, which allows a reduced shot size of resist solution.

Figure 5:
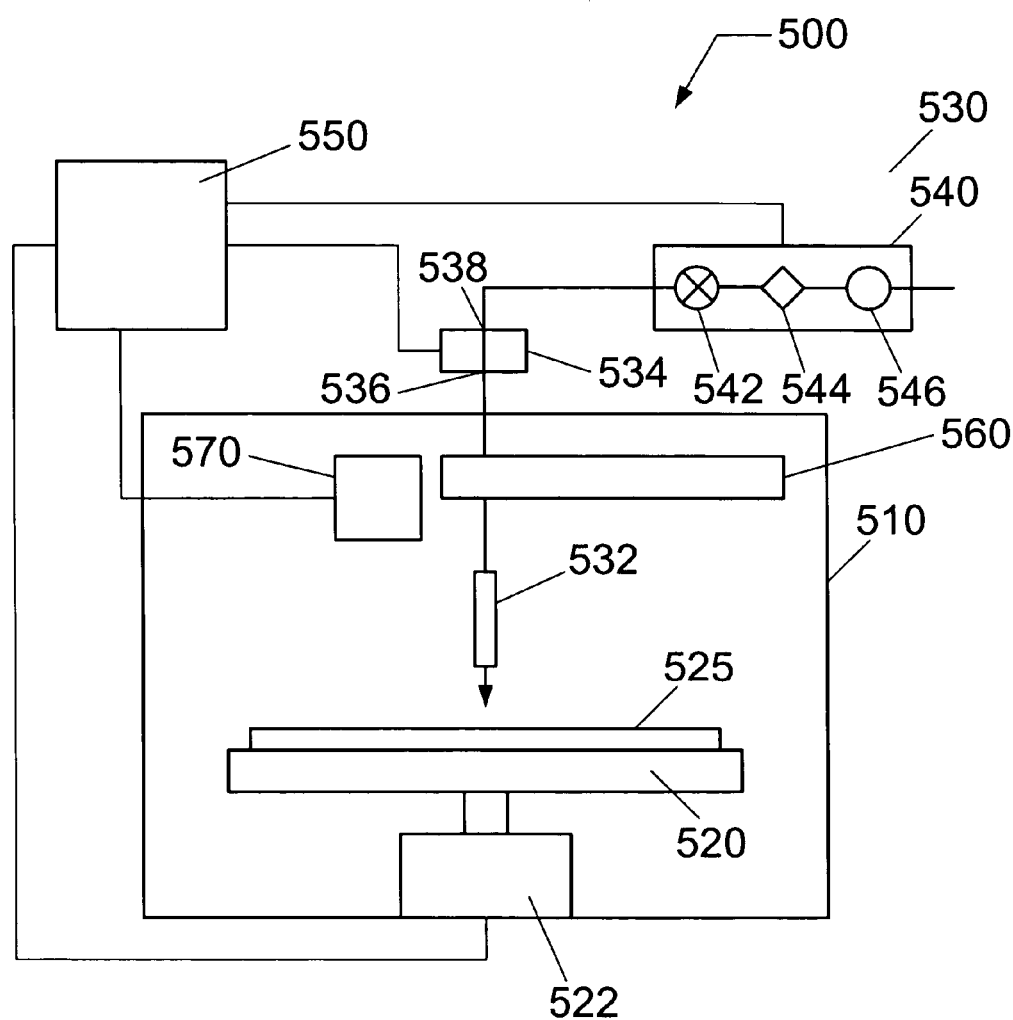
FIG. 5 presents a coating system for dispensing a solution on a substrate according to another embodiment of the invention.

According to another embodiment, FIG. 5 illustrates a coating system 500 including a coating chamber 510, a substrate holder 520 coupled to the coating chamber 510 and configured to support substrate 525, and a solution nozzle assembly 530 configured to dispense a solution, such as a resist solution. Additionally, the coating system 500 includes a controller 550 coupled to the substrate holder 520 and the solution nozzle assembly 530, and configured to exchange data, information, and control signals with the substrate holder 520 and the solution nozzle assembly 530.

The substrate holder 520 is configured to rotate (or spin) substrate 525 during dispensing of solution on the upper surface of substrate 525 from the solution nozzle assembly 530. A drive unit 522 coupled to the substrate holder 520 is configured to rotate the substrate holder 520. The drive unit 522 can, for example, permit setting the rotation rate, and the rate of acceleration of the substrate holder rotation.

The solution nozzle assembly 530 includes a single nozzle 532 positioned substantially near the center of substrate 525, and above an upper surface thereof. The nozzle 532 is configured to dispense a solution, such as a 248 nm photo-resist solution, a 193 nm photo-resist solution, a 157 nm photo-resist solution, an EUV (extreme ultraviolet) photo-resist solution, or any other coating solution, such as a low dielectric coating solution or a top/bottom anti-reflective coating (TARC/BARC) solution, on an upper surface of substrate 525 in a direction substantially perpendicular to the upper surface of substrate 525. Alternately, the solution nozzle assembly 530 includes a plurality of nozzles as depicted in FIG. 4. The nozzle 532 is coupled to an outlet end 536 of a control valve 534. An inlet end 538 of control valve 534 is coupled to a solution supply system 540. The control valve 534 can be configured to regulate dispensing the solution on substrate 525. When open, the solution is dispensed upon the substrate 525. When closed, the solution is not dispensed upon the substrate 525. The solution supply system 540 can include at least one of a fluid supply valve 542, a filter 544, and a flow measurement/control device 546.

Additionally, nozzle 532 is configured to translate in a radial direction from the center of substrate 525 to the peripheral edge of substrate 525 using translation drive assembly 560, while dispensing solution.

Referring still to FIG. 5, coating system 500 further includes diagnostic system 570 for determining the radial location of the wave front, the speed of the wave front, or the state of the wave front (e.g., stable wave front, or unstable wave front), or any combination thereof. A stable wave front may be one having a substantially circular shape, while an unstable wave front may have an irregular shape as discussed above. The diagnostic system 570 can be used to assist in controlling the wave front of the resist solution. The diagnostic system 570 can include a light sensing system and an image capturing system. For example, the light sensing system can include a CCD (charge coupled device) camera, or a CID (charge injection device) camera for detecting the progression of the solution wave front across substrate 525. Additionally, for example, the light sensing system can include a light projection device for providing background illumination of the solution on the upper surface of substrate 525. Furthermore, for example, the image capturing system can be configured to acquire and record images, and transmit these images to the controller 550 for determining the wave front position, speed, and state.

Referring still to FIG. 5, controller 550 can, for instance, compute the position of the wave front from frame to frame based upon the current location of the wave front relative to a calibrated pixel array (e.g., the pixel array for the camera set-up can be calibrated for position on the substrate). Additionally, controller 550 can, for instance, compute the speed of the wave front from frame to frame based upon the number of pixels elapsed (or passed) from one frame to the next divided by the time elapsed from one frame to the next. Additionally, for instance, controller 550 can determine the state of the wave front, i.e., whether or not the wave front includes a circular form spreading radially across substrate 525.

Figure 6:
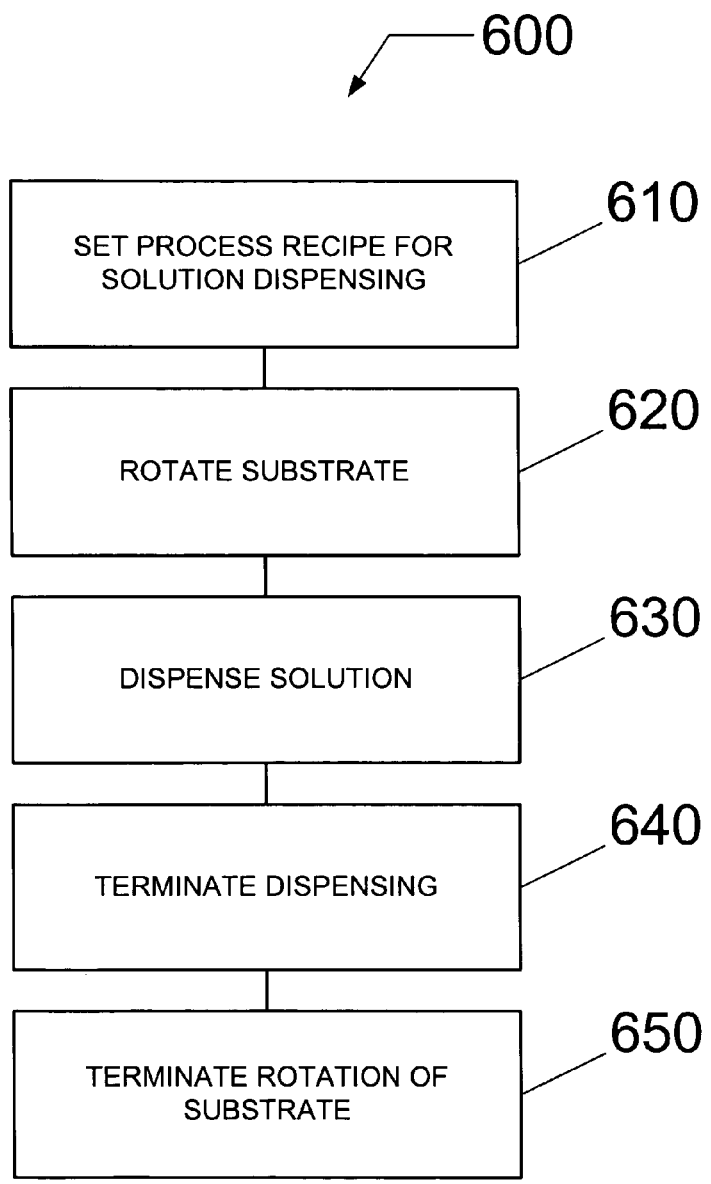
FIG. 6 depicts a method for dispensing a solution on a substrate according to a further embodiment of the invention.

FIG. 6 presents a method of dispensing a solution on a substrate according to an embodiment of the invention. As illustrated in FIG. 6, the method includes a flow chart 600 beginning at 610 setting a process recipe for solution dispensing. The process recipe can be designed for a specific type of solution taking into account its fluid properties, such as viscosity, surface tension, etc. Additionally, the process recipe can be designed for a total volume of solution to be dispensed.

The process recipe can include one or more process parameters including the dispensing rate of solution as a function of time, the rotation rate of the substrate holder as a function of time, or the translation rate of the solution nozzle assembly as a function of time, or any combination thereof. For example, the position or speed of the wave front can be utilized to update any of these process parameters during solution dispensing. For instance, increasing the rotation rate can increase the speed of the wave front, while decreasing the rotation rate can decrease the speed of the wave front. Additionally, for instance, increasing the dispensing rate can increase the speed of the wave front, while decreasing the dispensing rate can decrease the speed of the wave front.

In order to provide a uniform solution coating on the substrate for a given total volume of solution, the one or more process parameters for the process recipe can be determined using first principles fluid mechanic simulation, such as ANSYS, commercially available from ANSYS Inc., Southpointe, 275 Technology Drive Canonsburg, Pa. 15317, FLUENT, commercially available from Fluent Inc., 10 Cavendish Ct. Centerra Park, Lebanon, N.H. 03766, or CFD-ACE+, commercially available from CFD Research Corp., 215 Wynn Dr., Huntsville, Ala. 35805, or design of experiment (DOE) techniques, or monitoring and controlling the process in real-time using the diagnostic system described above for feedback, or any combination thereof.

According to an embodiment of the invention, the solution is dispensed above the substrate at a radial location substantially equivalent to or less than the current location of the wave front. Therefore, the radial translation rate of the solution nozzle, or the rate the radial location of solution dispensing is varied, is substantially equivalent to or less than the speed of the wave front. For example, the translation rate ranges from approximately 25% to approximately 100% the front speed. Alternately, the translation rate ranges from approximately 50% to approximately 100% the front speed. Alternately, the translation rate ranges from approximately 75% to approximately 100% the front speed. Alternately, the translation rate ranges from approximately 90% to approximately 100% the front speed. Alternately, the translation rate is substantially equivalent to the front speed.

At 620, rotation of the substrate is initiated per the process recipe. The substrate rotation can have an acceleration phase such that the substrate rotation rate is increased from rest to a first pre-specified rate of rotation. Once the first pre-specified rotation rate is achieved, the rotation rate can be maintained invariant or varied.

At 630, the solution is dispensed from the solution nozzle assembly onto the substrate for a first period of time. The dispensing of solution from the solution nozzle assembly can be initiated coincident with the rotation of the substrate. Alternately, the dispensing of solution from the solution nozzle assembly can be initiated after a delay in time.

At 640, the flow of solution from the solution nozzle assembly is terminated. The rate of rotation of the substrate can be maintained constant, or can be varied. For example, the rotation rate can be accelerated or decelerated (during an acceleration or deceleration phase) to a third pre-specified rate of rotation. At 650, the rotation of the substrate is terminated. During this time, the rate of rotation is decreased to rest during a fourth period of time.

Figure 7:
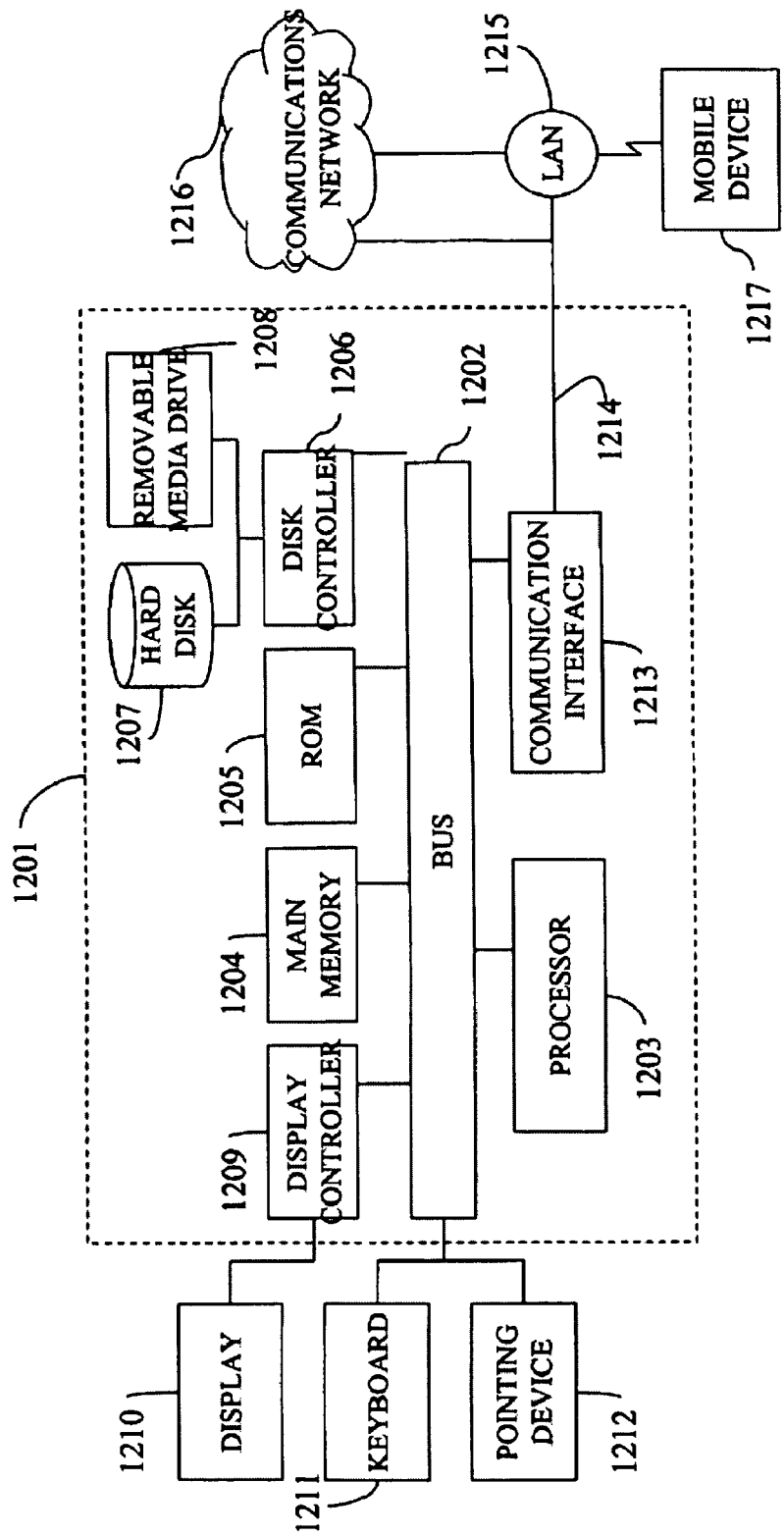
FIG. 7 depicts a computer system for implementing various embodiments of the invention.

FIG. 7 illustrates a computer system 1201 for implementing various embodiments of the present invention. The computer system 1201 may be used as the controller 450 to perform any or all of the functions of the controller described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Hence, numerous modifications and variations of the present invention are possible in light of the above teachings. It is therefore to be understood that within the scope of the appended claims, the invention may be practiced otherwise than as specifically described herein. For example, other configurations of the solution nozzle assembly and other processes may be used to dispense the solution on the substrate.

The invention claimed is:

1. A method of dispensing a solution on a substrate, comprising:
   rotating said substrate;
   dispensing said solution from a nozzle on said substrate in order to form a wave front that spreads radially across an upper surface of said substrate, wherein said solution initially dispenses at a center of said substrate, and progresses to dispense at a radial location of said substrate substantially equivalent to or less than a radial position of said wave front at any instant in time;
   monitoring in real-time stability of said wave front on the upper surface of said substrate;
   controlling said dispensing in response to the monitored stability of said wave front by adjusting a radial translation rate of the nozzle;
   terminating said dispensing of said solution; and
   terminating said rotating of said substrate.

2. The method of claim 1, further comprising:
   setting a process recipe in order to achieve said dispensing, wherein said process recipe is designed for a total volume of the solution to dispense, and the recipe includes a dispensing rate from said nozzle, a rotation rate for said substrate rotation, and a radial translation rate of said nozzle.

3. The method of claim 1, wherein said dispensing of said solution progresses to dispense at a radial location ranging from approximately 25% to 100% of said radial position of said wave front.

4. The method of claim 1, wherein said dispensing of said solution progresses to dispense at a radial location ranging from approximately 50% to 100% of said radial position of said wave front.

5. The method of claim 1, wherein said dispensing of said solution progresses to dispense at a radial location ranging from approximately 75% to 100% of said radial position of said wave front.

6. The method of claim 1, wherein said dispensing of said solution progresses to dispense at a radial location ranging from approximately 90% to 100% of said radial position of said wave front.

7. The method of claim 1, wherein said dispensing of said solution progresses to dispense at a radial location substantially equivalent to said radial position of said wave front.

8. The method of claim 1, wherein said dispensing of said solution translates radially from the center of said substrate to the edge of said substrate.

9. The method of claim 8, wherein said dispensing translates radially at a translation rate substantially equivalent to or less than a speed of said wave front.

10. The method of claim 9, wherein said translation rate ranges from approximately 25% to 100% of said speed of said wave front.

11. The method of claim 9, wherein said translation rate ranges from approximately 50% to 100% of said speed of said wave front.

12. The method of claim 9, wherein said translation rate ranges from approximately 75% to 100% of said speed of said wave front.

13. The method of claim 9, wherein said translation rate ranges from approximately 90% to 100% of said speed of said wave front.

14. The method of claim 9, wherein said translation rate is substantially equivalent to said speed of said wave front.

15. The method of claim 1, further comprising:
   supplying said solution to said nozzle from a solution supply system.

16. The method of claim 15, wherein said solution supply system comprises at least one of a fluid supply valve, a filter, a flow measurement device, and a flow control device.

17. The method of claim 1, wherein said solution comprises a 248 nm resist solution, a 193 nm resist solution, a 157 nm resist solution, an extreme ultraviolet (EUV) resist solution, a low dielectric constant material solution, an anti-reflective coating (ARC) solution, or a top coat solution.

18. The method of claim 2, wherein the controlling further comprises adjusting the dispensing rate from said nozzle, the rotation rate of said substrate rotation, or any combination thereof.

19. The method of claim 1, wherein the monitoring the stability of the wave front includes:
   imaging the wave front with an image capturing system configured to capture an image of the wave front.

20. The method of claim 1, wherein the monitoring the stability of the wave front includes:
   determining whether the wave front has an irregular shape including leading portions farther from the center of the substrate than non-leading portions.

* * * * *